Figure 1:
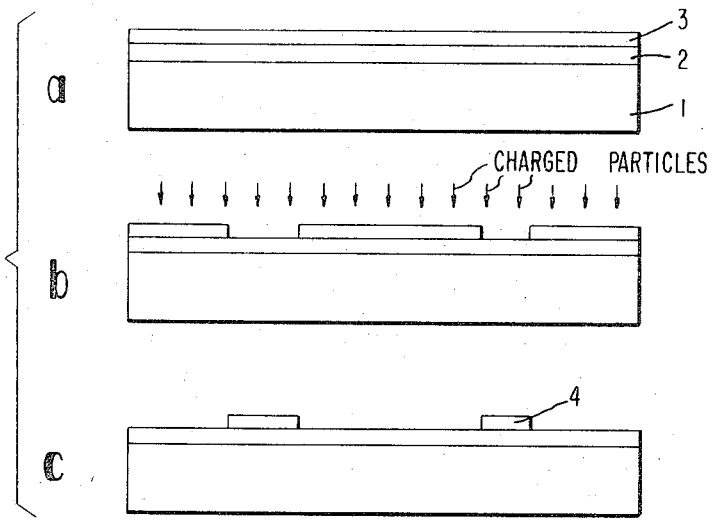
Figure 2:
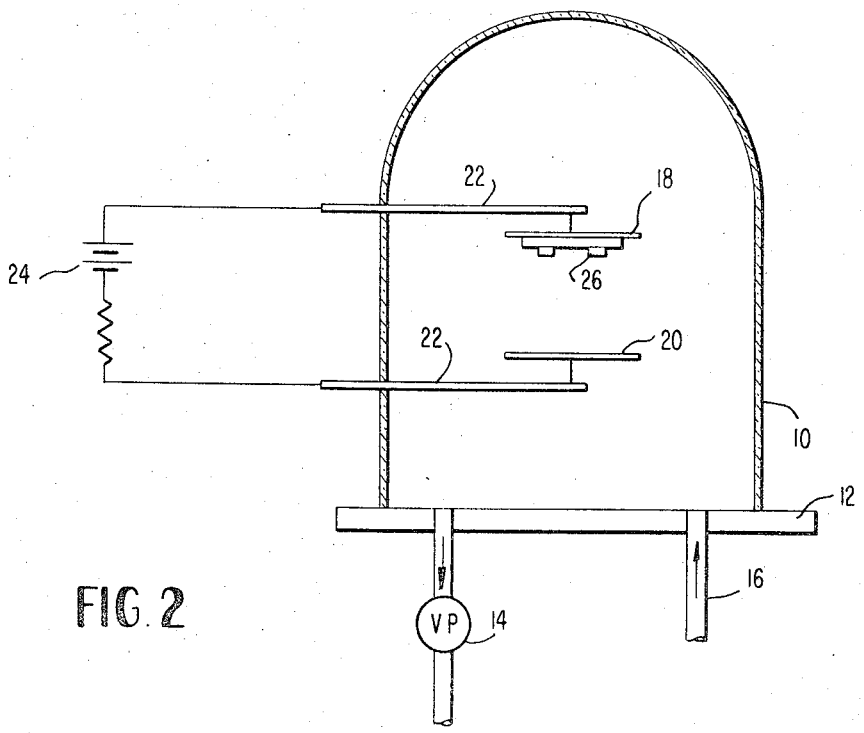

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED FEBRUARY 2, 1971

883 O.G. 9

T883,005

METHOD FOR PRODUCING DIMENSIONALLY STABLE PHOTOSENSITIVE RESIST PATTERN

Max J. Schuller, 917 Sycamore Drive, Palo Alto, Calif. 94303; Michael J. Urban, 27 London Lane, Stamford, Conn. 06902; and Erwin Littau, 75 Grand View Ave., Norwalk, Conn. 06850

Continuation of application Ser. No. 525,018, Feb. 4, 1966. This application Nov. 6, 1969, Ser. No. 871,540

Int. Cl. G03c *5/00*

U.S. Cl. 96—36.2

1 Sheet Drawing. 4 Pages Specification

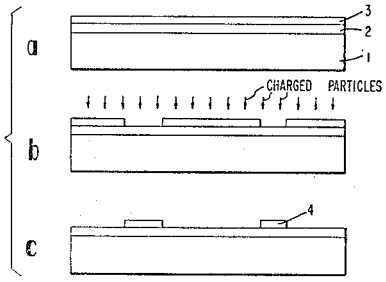

A method for depositing thin film electrical elements of closely controlled dimensions onto a substrate wherein a coating of a photosensitive resinous resist (KTFR) is applied to the surface of the substrate; selected areas of the resist are exposed to light; the unexposed areas of the resist are removed by developing; remaining resist pattern is subjected to a bombardment of electrically charged particles from a glow discharge initiated by an impressed potential of from 800 to 2,000 volts to stabilize the dimensions of the photosensitive resist pattern; and thin film elements are deposited at elevated temperatures to areas from which the resist has been removed.

Feb. 2, 1971 M. J. SCHULLER ET AL T883,005

METHOD FOR PRODUCING DIMENSIONALLY STABLE PHOTOSENSITIVE RESIST PATTERN

Original Filed Feb. 4, 1966

INVENTORS

MAX J. SCHULLER
MICHAEL J. URBAN
ERWIN LITTAU

BY Sughrue, Rothwell, Mion, Zinn & Macpeak

ATTORNEYS